United States Patent [19]

Moroi

[11] Patent Number: 5,052,886
[45] Date of Patent: Oct. 1, 1991

[54] SEMICONDUCTOR WAFER ORIENTATION DEVICE

[75] Inventor: Masayuki Moroi, Garland, Tex.

[73] Assignee: Texas Instruments Incorporated, Dallas, Tex.

[21] Appl. No.: 286,916

[22] Filed: Dec. 20, 1988

[51] Int. Cl.⁵ .................................. B65G 47/24
[52] U.S. Cl. .................................. 414/757; 198/394; 414/786
[58] Field of Search ............ 198/394; 414/433, 757, 414/786

[56] References Cited

U.S. PATENT DOCUMENTS

| 3,623,712 | 11/1971 | McNeilly et al. | 263/41 |
| 4,047,496 | 9/1977 | McNeilly et al. | 118/49.1 |
| 4,048,955 | 9/1977 | Anderson | 118/49.5 |
| 4,081,313 | 3/1978 | McNeilly et al. | 156/610 |
| 4,376,482 | 3/1983 | Wheeler et al. | 198/394 |
| 4,441,853 | 4/1984 | Kosugi | 414/757 |
| 4,483,434 | 11/1984 | Miwa et al. | 198/394 |
| 4,887,904 | 12/1989 | Nakazato et al. | 414/757 X |
| 4,892,455 | 1/1990 | Hine | 414/757 X |

Primary Examiner—David A. Bucci
Assistant Examiner—Janice Krizek
Attorney, Agent, or Firm—B. Peter Barndt; James T. Comfort; Melvin Sharp

[57] ABSTRACT

A device having a circled array of tapered motor driven rollers center and find the flat edge of a semiconductor wafer by rotating the wafer until the flat edge is over a photo cell, at which time finder rollers secure the wafer in its centered and orientated position.

11 Claims, 5 Drawing Sheets

SEMICONDUCTOR WAFER ORIENTATION DEVICE

FIELD OF THE INVENTION

This invention relates to continuous chemical vapor deposition reactors, and more particularly to improvements in semiconductor wafer orientation devices for use with such reactors.

BACKGROUND OF THE INVENTION

A continuous chemical deposition reactor may be a stand-alone process system with a continuous semiconductor wafer flow. Basic subsystems in such a system may include a wafer handler, a reaction chamber, a gas flow system, a cooling system, and an electrical system.

The wafer handling system may include wafer loaders and unloaders, wafer carriers, and a track for moving a wafer through the reactor chambers. The semiconductor wafers are orientated to a known position so that pick-up devices may properly place the wafer in a carrier, which is indexed through the reactor system.

A basic reactor and process may be as follows. A semiconductor wafer is first picked-up by a wafer handling device. The wafer is then oriented prior to being loaded onto a carrier which enters one end of the reactor through a port and is moved successively through the various chambers and out the other end of the reactor through another port. Each semiconductor wafer is a round disk with a flat edge thereon, the flat edge being used to permit orientation of the wafer for placement in a carrier prior to transporting the wafer through the process reactor. The reactor may not be physically closed, but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber and the last chamber is a nitrogen seal. A typical gas supply system may supply gases for two different deposition processes which may be directed into any of the deposition chambers. Each chamber is effectively divided into two portions, a top portion and a bottom portion by the substrate carrier. The junctions between the chambers effectively isolate one chamber from the other by the flow of gases, or the exhaust gases from the chambers.

SUMMARY OF THE INVENTION

The invention relates to devices for moving and orienting a semiconductor wafer for placement in a wafer carrier which may be used in, for example, a multi-chamber continuous chemical vapor deposition reactor and subsystems therein through which substrates may be passed in order to perform etching and various deposition processes thereon. A semiconductor wafer is removed from a wafer cassette by a robotic arm which has a pick-up device which picks-up the wafer from the upper side of the wafer without using the edge of the wafer, thus removing the tendency to stress, and eliminating the picker dimensional accuracy. The picker travels freely up and down and does not have to initially engage the surface of the wafer in a parallel orientation to eliminate stress or pressure being applied to the wafer. Tapered posts are used so that the picker mechanism seats in the same place or location each time a wafer is picked-up and is placed in a carrier.

Prior to placement in the carrier, the wafer must be centered and oriented so that the wafer may be placed in the carrier without breaking the wafer. In this respect, since the wafer is generally round with a flat reference edge, the flat edge must be in a known position so that it may correspond to the flat orientation position in the carrier. To accomplish wafer orientation, the wafer is placed on a centering mechanism that has several tapered posts. At least one of the tapered posts is turned to rotate the wafer until the flat orientation flat on the wafer is positioned over an optical sensor. The tapered post centers the wafer and the optical sensor locates the orientation flat so that the wafer may be picked up centered on the picker, and placed in the wafer carrier with the orientation flat on the wafer matching the flat on the carrier.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
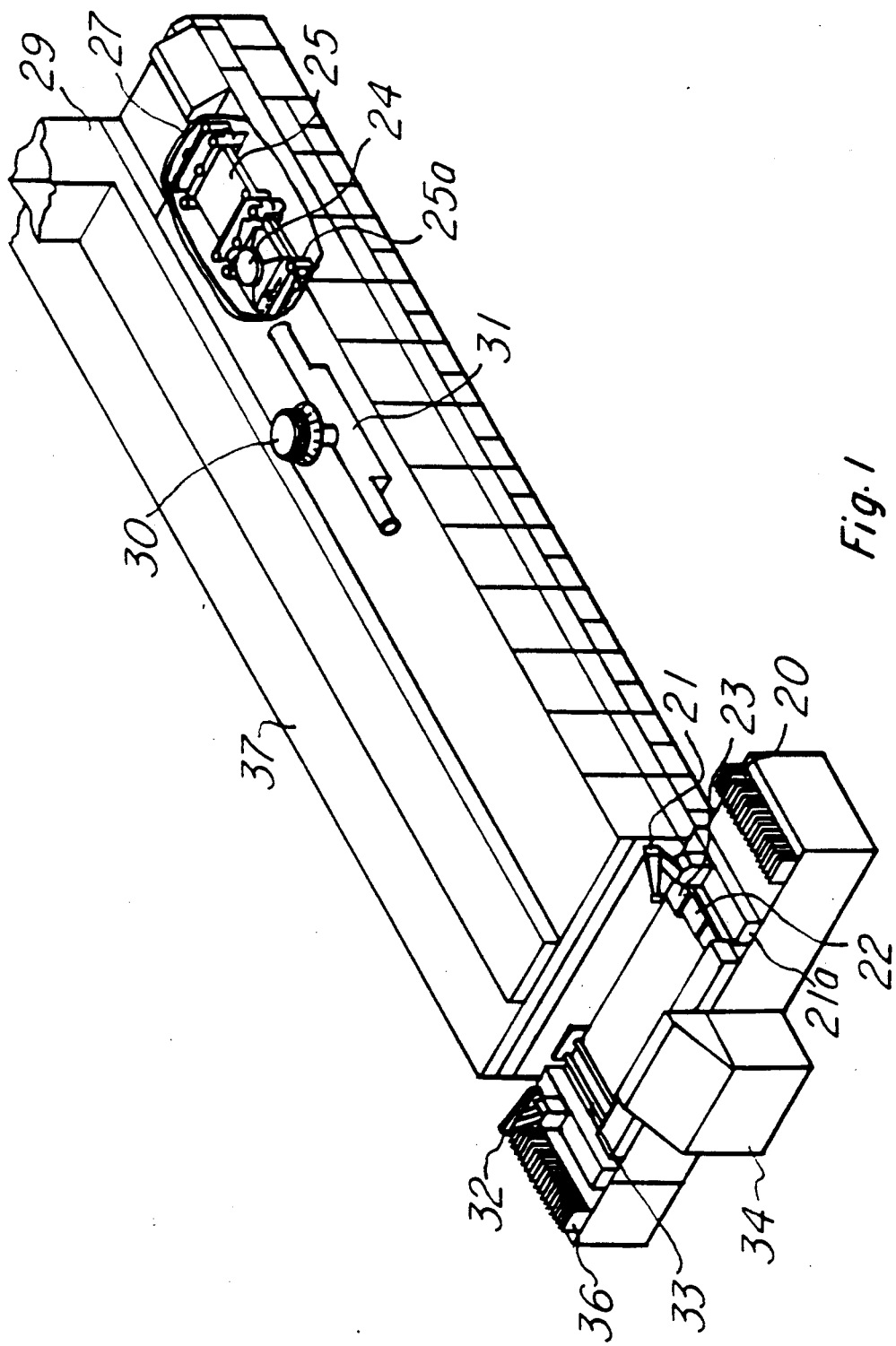
FIG. 1 illustrates a typical continuous chemical vapor deposition reactor in which the invention may be used.

FIG. 1 illustrates a typical reactor utilizing the present invention. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette. The robotic arm lifts a wafer from a cassette and places it in a carrier 22 at the entrance to the reactor. The entrance 23 to the reactor is a seal joint to prevent gases in the reactor from exiting from the reactor.

At the entrance 23, and before the carrier enters the reactor a vacuum pick-up arm (not illustrated) lifts the lid from the carrier to allow the robotic arm to place a semiconductor wafer into the carrier. After the semiconductor is placed into the carrier the carrier lid is replaced and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber. The indexing is continuous, and as the carrier exits from the last reaction chamber it is indexed through the return path of the reactor to the exit opening in the reactor, where the lid of the carrier is removed by the return lid pick-up (not illustrated). Tracks 33, which extend throughout the reactor, are used to move the wafer carrier through the reactor. A robotic arm 32 mounted on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted.

Positioned over each reaction chamber is a heater block 24, used to heat the reaction chamber to a desired temperature. Water to cool the lamp housing is introduced through the junctions 25a though inlet 26.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 2:
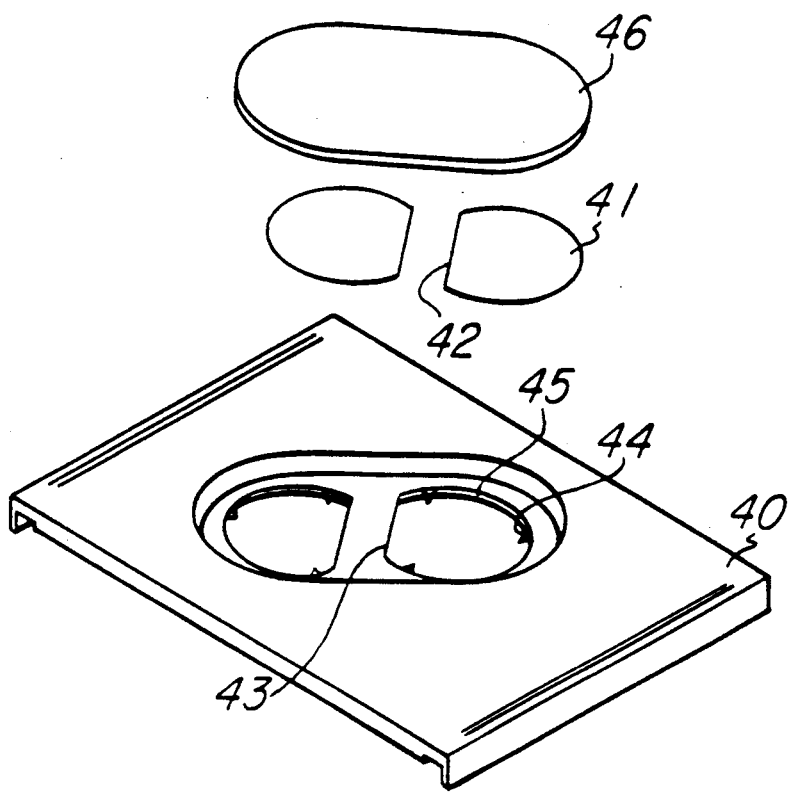
FIG. 2 illustrates an example of a semiconductor carrier with an orientation flat.

FIG. 2 illustrates a wafer carrier 40 having an opening 45 therein into which is placed a semiconductor wafer 45. The wafer has one flat edge 42 which is used to index or orientate the wafer. Opening 45 also has a flat side 43 to match the flat edge 42 of the semiconductor wafer. Tabs 44 protrude from the bottom of opening 45 to hold the semiconductor in the opening and to expose a maximum of the under side of the wafer, which is the process side of the wafer. A lid is used to cover the up or back side of the wafer during processing.

Figure 3:
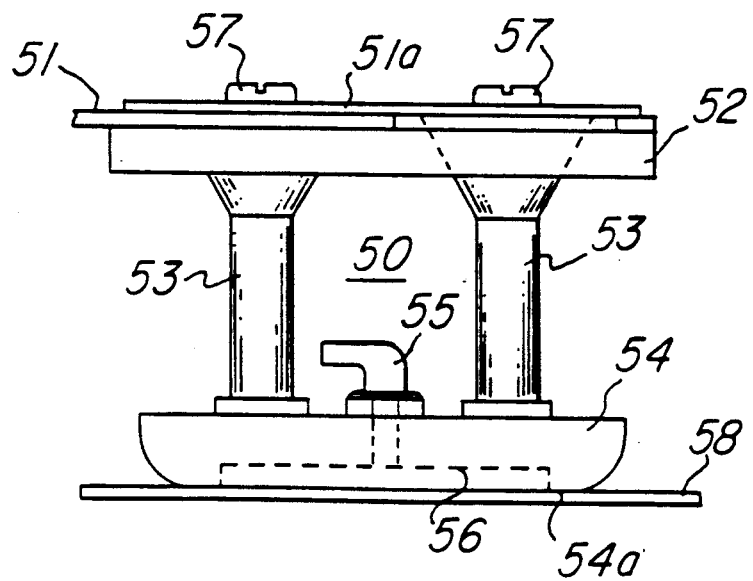
FIG. 3 illustrates a semiconductor picker of the present invention.

FIG. 3 illustrates the pick mechanism used on the end of a robotic arm to move the semiconductor wafer to be processed to a centering and orientating device. The mechanism 50 is movably mounted on an extension of the robotic arm 51,52. Pick-up device 50 includes two posts 53, each having one end tapered in a generally conical shape. The two posts 53 are mounted between upper plate 51a and lower pick-up device 54. Plate 51 is secured to post 53 by screws 57. The post may be either bonded to or secured to pick-up device 54 by threaded holes (not shown).

Pick-up device has a fitting 55 mounted thereon which attaches to a vacuum source (not illustrated) and opens into vacuum cavity 56 in the bottom surface of pick-up device 54. When pick-up device 54 is lowered into contact with a semiconductor device 58 with a vacuum applied, semiconductor wafer 58 will be drawn up against the bottom surface 54a of pick-up device 54 and held there until the vacuum is removed or released. While the semiconductor device is held against the bottom surface of the pick-up device it may be moved, for example from a loading surface/cassette to the centering and orientating mechanism described below.

Figure 4:
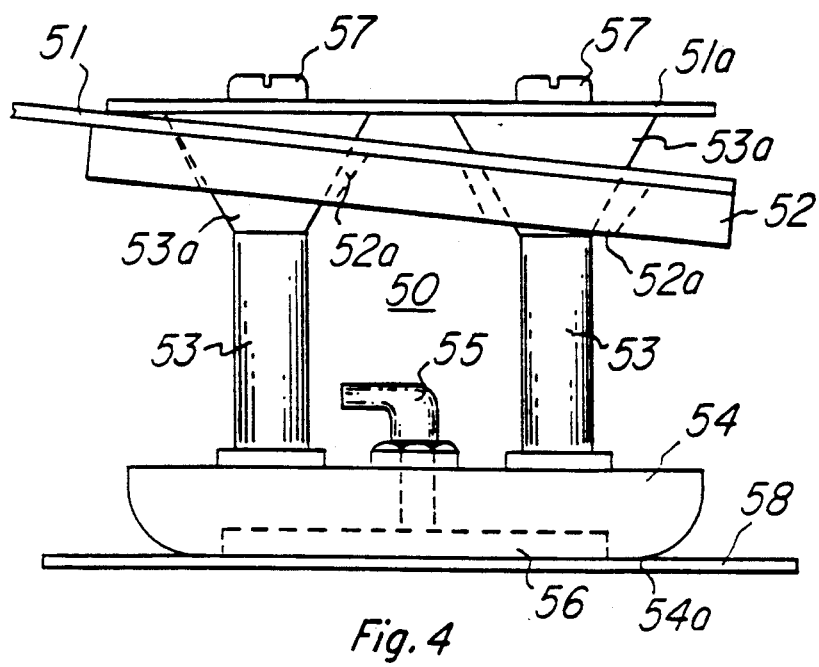
FIG. 4 illustrates the semiconductor picker of FIG. 3 in another position.

FIG. 4 illustrates the picking-up of a wafer without placing stress on the wafer, allowing a vacuum to be drawn against the wafer thereby allowing the wafer to be picked-up. In prior art reactor systems, the semiconductor wafer is usually processed face up so that the wafer has to be picked-up by the edge and not by a face of the wafer. In the present invention, when the robotic arm is lowered to pick-up a semiconductor wafer, the bottom surface comes into contact with the bottom or non-process surface of semiconductor wafer 58. Since the robotic arm is being angled down, the bottom surface 54 of the pick-up device does not move parallel into engagement with the surface of the semiconductor wafer.

To avoid applying excessive pressure on the surface of the semiconductor wafer, and to permit the entire bottom surface 54a to come into contact with the semiconductor wafer surface, posts 53 are not secured to arm 51 and part 52. The tapered ends 53a of posts 53 reside in tapered holes 52a in robotic arm parts 51 and 52 such that when the arm 51 is lowered and surface 54a comes into contact with the surface of the semiconductor wafer, arm 51 may continue downward a short distance without additional pressure against the semiconductor wafer.

The movement of pick-up device 50 becomes essentially independent of the movement of arm 51 permitting the lower surface 54a to continue to move such that it becomes parallel to the surface of the semiconductor wafer, thereby permitting a vacuum to be drawn in vacuum cavity 56, holding and securing the semiconductor wafer to the bottom of the pick-up device.

When arm 51 is raised, the tapered part 53a of post 53 positions the pick-up device to a fixed and known position at the end of robotic arm 51, and therefore positions the semiconductor in a known position. This precise positioning of the pick-up device is important in later properly orienting the semiconductor wafer.

Figure 5:
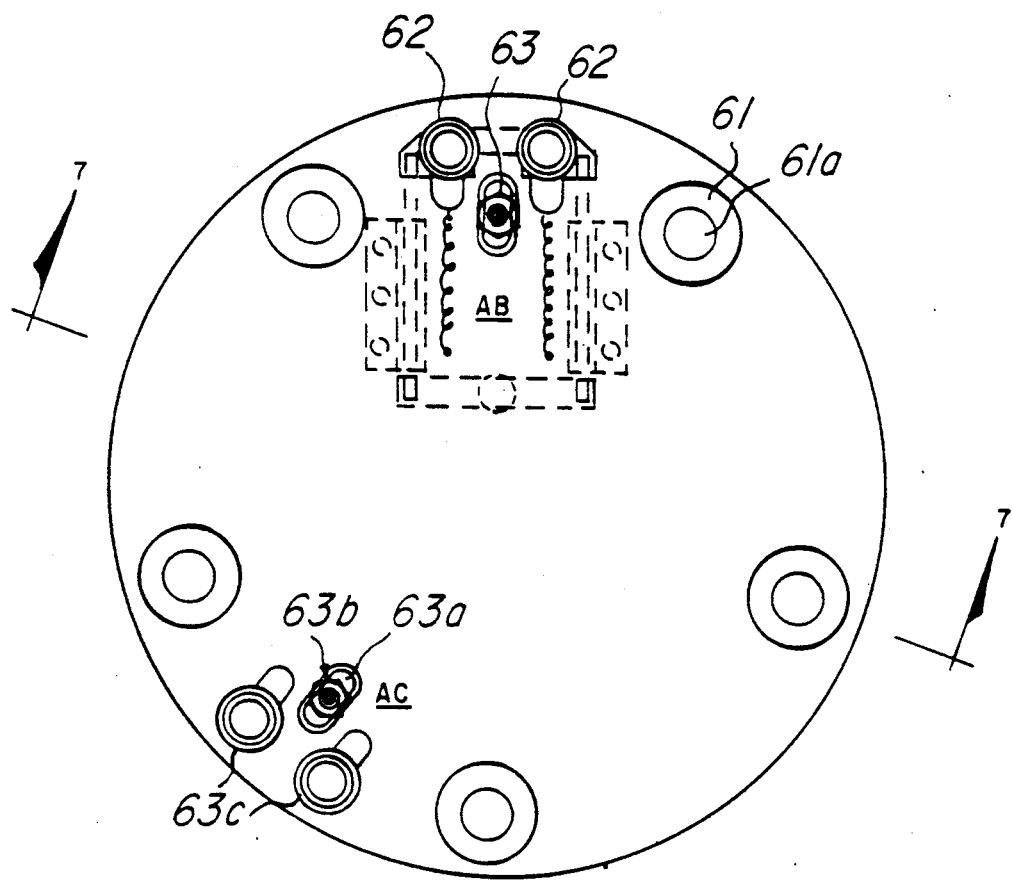
FIG. 5 illustrates a top view of the semiconductor wafer centering and orientation mechanism.
Figure 6:
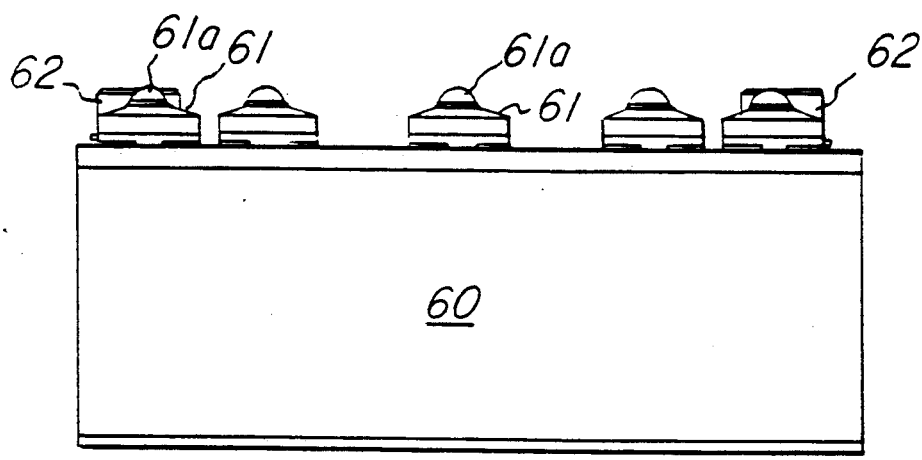
FIG. 6 is a side view of the centering and orientation mechanism of FIG. 5.
Figure 7:
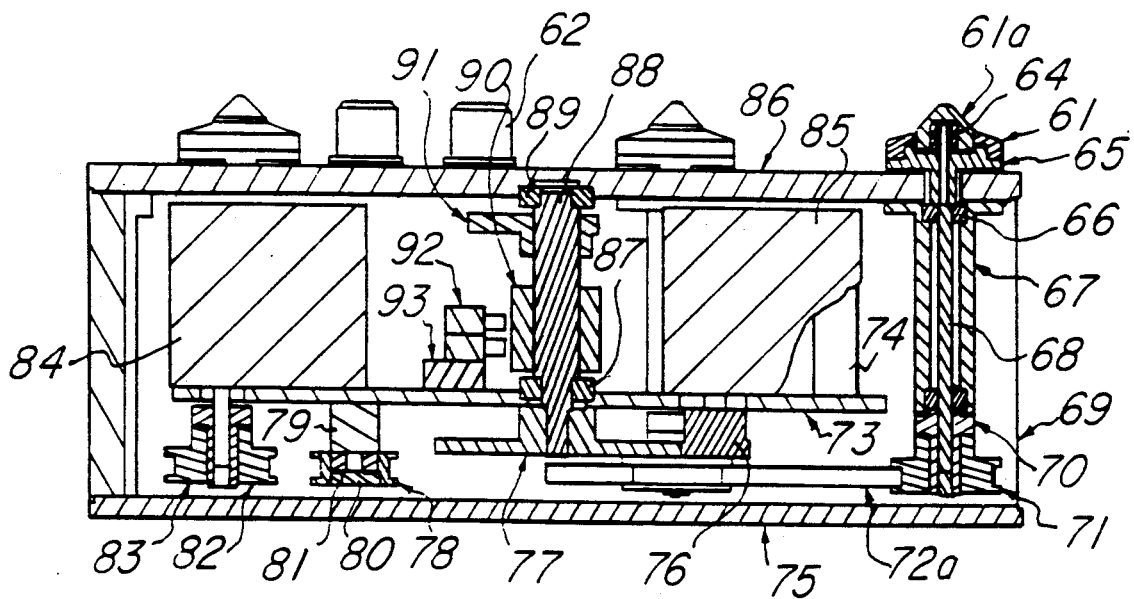
FIG. 7 is a side view in section of the centering and orientation mechanism of FIG. 5.

FIGS. 5, 6 and 7 illustrate a device for centering a semiconductor wafer and finding the flat edge of the wafer. FIG. 5 is the top view of the centering and orientation device 60. There are five rollers having a top roller 61a and a wafer orientation roller 61. There are four rollers 62 that engage the flat side of the wafer and two fiber optic cables 63,63b. A semiconductor wafer is placed down over the rollers 61,61a such that the edges of the wafer will slide down the tapered surface of top roller 61a and come to rest on the surface of orientation roller 61.

When the rollers 61 are rotated, the semiconductor wafer will become centered, and rotation will continue until the flat edge of the semiconductor exposes the end of fiber optic light detector 63. At this time rotation of rollers 61 stops and rollers 62 engage the flat side of the wafer. Rollers 62 are spring loaded so that as the wafer rotates, the round edge of the wafer engages the rollers in a position toward the edge of the device 60, however when the flat part of the device rotates around to the location of the rollers 62, they will be drawn to the flat edge by springs. Rollers 62 move back and forth in slots 63a and provide the final adjustment or orientation for the wafer. Light impinging on the end of the fiber optic indicates that the flat edge of the wafer is in the location of the fiber optics 63 and the flat edge rollers 62.

FIG. 6 is a side view of orientation device 60 showing the tapered surfaces of rollers 61 and 61a, and the vertical sides of rollers 62.

FIG. 7 is cross-sectional view taken through section 7—7 of FIG. 5. Centering orientation device 60 has an outer cover 69, a top base plate 86 and a bottom base plate 75. The mechanism for rotating rollers 61 is shown in detail at the right side of FIG. 7.

Rollers 61a are freely rotating rollers mounted on the top end of shaft 68, which is mounted in top and bottom bearings 66. The rollers are mounted at the end of shaft 68 and ride on roller table 65. A pulley 71 is mounted on the bottom end of shaft 68 on bushing 70. Shaft 68 is rotated by motor/pulley combination 84,82. Pulley 82 drives timing belt 72a, which drives pulley 71 on shaft 68 and the pulleys (including pulley 72) on the other roller shafts.

Motor 85 turns drive shaft 88 via gear 77. Drive shaft 88 is mounted in bearings 87 and 89.

Figure 8:
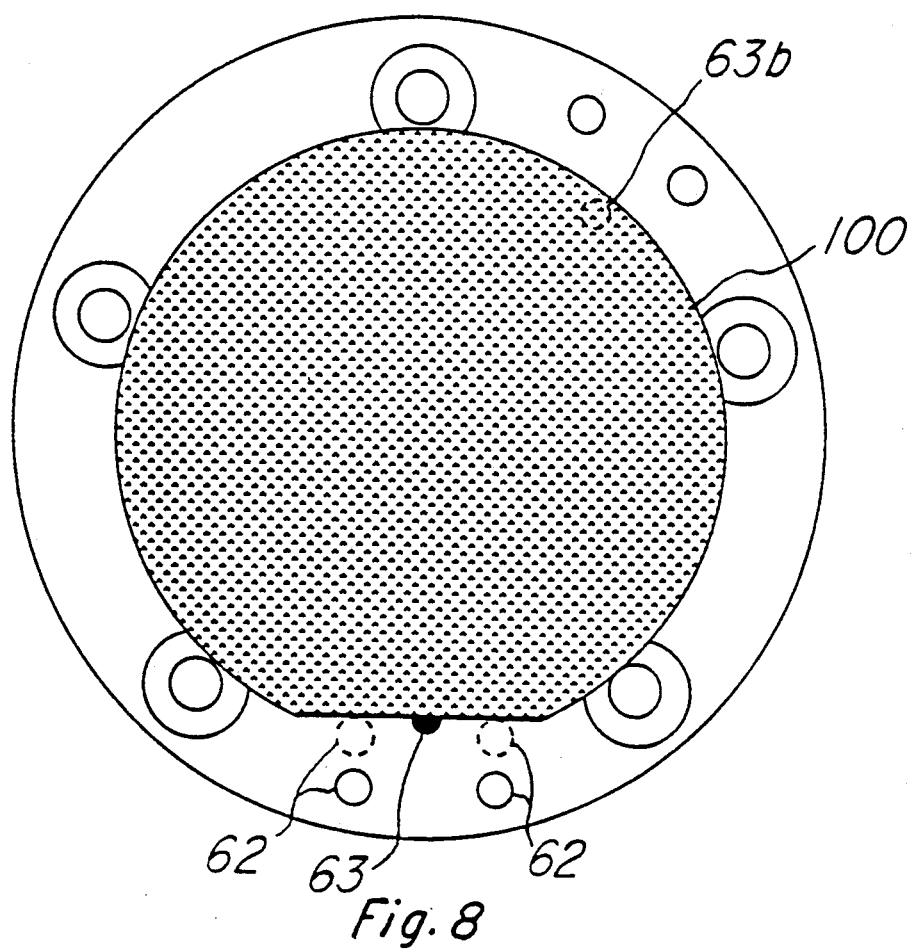
FIG. 8 illustrates a centered and orientated semiconductor wafer.

A wafer is lowered onto rollers 61 as shown in FIGS. 5 and FIG. 8. The wafer is rotated by motor 84, drive shaft 83 and pulleys 71 and 82, with drive belt 72a. A preliminary location for the flat on the wafer is found by light sensor 63 in locator assembly AB and stops drive motor 84. The final location for the flat on the semiconductor wafer is determined when drive motor 85 turns gears 76, 77 and shaft 88, which in turn rotates cam 91, releasing flat finders 62. At the same time, cam 90 on shaft 88 opens switch 92 on mount 93, stopping motor 85. Springs 62c pull the flat finders 62 toward the center of the centering device causing the wafer to be correctly oriented. At the same time rollers 61a rotate freely, thereby reducing friction and allowing a long or short rotation time as required to orientate the wafer. Once the wafer is orientated, the robotic pick-up device illustrated in FIGS. 3 and 4 can pick up the semiconductor wafer and place it in a wafer carrier.

The flat of the next semiconductor wafer to be orientated may have the flat stopped at locator assembly AC, sensor 63b and flat finders 63c. By having at least two locator assemblies, the flat is located in minimum time.

FIG. 8 shows a semiconductor wafer supported by rollers 61 and centered between the rollers 61a. Rollers 62 are illustrated in the extended position 62 in solid lines and retracted positions in dashed lines. Fiber optic end is shown at 63 at the flat edge of the wafer. The end of the fiber optic is shown in dashed lines, under the wafer at the second optical fiber location 63b.

What is claimed is:

1. A device for centering and orientating a semiconductor wafer having an orientation flat on its edge, comprising:
   a housing;
   a plurality of rotating tapered rollers extending above the housing for centering the semiconductor wafer;
   at least one drive motor for rotating the tapered rollers;
   a photo cell for detecting the orientation flat on the semiconductor wafer;
   a pair of spring biased flat finder rollers which are drawn against the flat by the springs when the semiconductor wafer flat is adjacent the photo cell and the flat finder rollers; and
   a second drive motor and a cam, wherein when the photo cell detects a flat, the said at least one drive motor stops and the second drive motor turns said cam allowing the flat finder rollers to be drawn against the flat, because of said spring bias, of the semiconductor wafer.

2. The device according to claim 1, including a second photo cell and a second pair of spring biased flat finder rollers to reduce the time required to orientate the semiconductor wafer.

3. The device according to claim 1, wherein the tapered rollers have a first tapered surface and a second tapered surface, the first tapered surface guiding the semiconductor wafer to the second tapered surface causing it to be centered during rotation of the tapered rollers and the semiconductor wafer for orientation purposes.

4. The device according to claim 1, wherein said housing has a top surface and said rotating tapered rollers each rotate about a shaft and are spaced above the top surface of the housing in a circle that has a diameter slightly larger than the diameter of the semiconductor wafer to be centered and orientated.

5. A device for centering and orientating a semiconductor wafer having an orientation flat on its edge, comprising:
   a housing;
   a plurality of rotating tapered rollers extending above the housing for centering the semiconductor wafer;
   at least one drive motor for rotating the tapered rollers;
   a photo cell for detecting the orientation flat on the semiconductor wafer;
   a pair of spring biased flat finder rollers which are drawn against the flat when the semiconductor wafer flat is adjacent the photo cell and the flat finder rollers;
   a second photo cell and a second pair of spring biased flat finder rollers to reduce the time required to orientate the semiconductor wafer; and
   a second drive motor and a cam, wherein when the photo cell detects a flat, the said at least one drive motor stops and the second drive motor turns said cam allowing the flat finder rollers which are adjacent the flat to be drawn against the flat of the semiconductor wafer.

6. The device according to claim 5, wherein the tapered rollers have a first tapered surface and a second tapered surface, the first tapered surface guiding the semiconductor wafer to the second tapered surface causing it to be centered during rotation.

7. The device according to claim 5, wherein said housing has a top surface and said rotating tapered rollers each rotate about a shaft and are spaced above the top surface of the housing in a circle that has a diameter slightly larger than the diameter of the semiconductor wafer to be centered and orientated.

8. A method for centering and orientating a semiconductor wafer comprising the steps of;
   lowering a semiconductor wafer onto tapered rollers;
   rotating the tapered rollers and thereby the semiconductor wafer with one motor and centering the semiconductor wafer during rotation;
   continuing rotation of the tapered rollers and semiconductor wafer until a flat of the semiconductor wafer is over a photo cell;
   stopping the rotating wafer; and
   moving flat finder rollers against the flat of the semiconductor wafer to establish its centered orientation, the flat finder rollers being moved into engagement with the flat due to the action of a second motor.

9. A device for centering and orienting a semiconductor wafer having an orientation flat on its edge, comprising:
   a housing;
   a plurality of rotating tapered rollers extending above the housing;
   at least one drive motor for rotating the tapered rollers;
   a photo cell for detecting the orientation flat on the semiconductor wafer;
   a pair of flat finder rollers which are drawn against the flat when the semiconductor wafer flat is adjacent the photo cell;
   a second photo cell and a second pair of flat finder rollers to reduce the time required to orientate the semiconductor wafer; and a second drive motor and a cam, wherein when the photo cell detects a flat, the said at least one drive motor stops and the second drive motor turns said cam allowing the flat finder rollers which are adjacent the flat to be drawn against the flat of the semiconductor wafer.

10. The device according to claim 9, wherein the tapered rollers have a first tapered surface and a second tapered surface, the first tapered surface guiding the semiconductor wafer to the second tapered surface causing it to be centered during rotation of the tapered rollers and the semiconductor wafer for orientation purposes.

11. The device according to claim 9, wherein said housing has a top surface and said rotating tapered rollers each rotate about a shaft and are spaced above the top surface of the housing in a circle that has a diameter slightly larger than the diameter of the semiconductor wafer to be centered and orientated.

* * * * *